(12) United States Patent
Shimizu et al.

(10) Patent No.: US 10,529,762 B2
(45) Date of Patent: * Jan. 7, 2020

(54) SOLID-STATE IMAGING APPARATUS AND METHOD OF MANUFACTURING THE SAME

(71) Applicant: SONY CORPORATION, Tokyo (JP)

(72) Inventors: Masahiko Shimizu, Kanagawa (JP); Toshiaki Iwafuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/944,942

(22) Filed: Apr. 4, 2018

(65) Prior Publication Data

US 2018/0226446 A1 Aug. 9, 2018

Related U.S. Application Data

(63) Continuation of application No. 15/298,819, filed on Oct. 20, 2016, now Pat. No. 9,966,403, which is a (Continued)

(30) Foreign Application Priority Data

Feb. 18, 2011 (JP) ................... 2011-033687

(51) Int. Cl.
*H01L 27/146* (2006.01)
*H01L 23/00* (2006.01)

(52) U.S. Cl.
CPC ........ *H01L 27/14623* (2013.01); *H01L 24/97* (2013.01); *H01L 27/14618* (2013.01); *H01L 27/14627* (2013.01); *H01L 27/14632* (2013.01); *H01L 27/14643* (2013.01); *H01L 27/14685* (2013.01); *H01L 27/14687* (2013.01); *H01L 2224/48091* (2013.01); (Continued)

(58) Field of Classification Search
None
See application file for complete search history.

(56) References Cited

U.S. PATENT DOCUMENTS 9,478,573 B2 * 10/2016 Shimizu ............ H01L 27/14685
2010/0259766 A1 10/2010 Wiese et al.
(Continued)

FOREIGN PATENT DOCUMENTS

JP 03/066162 A 3/1991
JP 08-088339 A 4/1996
(Continued)

OTHER PUBLICATIONS

Notice of Allowance for U.S. Appl. No. 15/298,819, dated Jan. 12, 2018, 08 pages.

(Continued)

*Primary Examiner* — Jack S Chen
(74) *Attorney, Agent, or Firm* — Chip Law Group

(57) ABSTRACT

A solid-state imaging apparatus includes an imaging section and a substrate. The imaging section has a light-receiving portion for receiving light from an object to image the object and the imaging section is disposed on the substrate. A member is provided on the substrate in the neighborhood of the light receiving portion and the member is partially or entirely coated in black.

13 Claims, 8 Drawing Sheets

Related U.S. Application Data continuation of application No. 13/352,846, filed on Jan. 18, 2012, now Pat. No. 9,478,573.

(52) U.S. Cl.
CPC ............ *H01L 2224/48227* (2013.01); *H01L 2224/48463* (2013.01); *H01L 2224/48465* (2013.01); *H01L 2224/49175* (2013.01); *H01L 2924/19105* (2013.01)

(56) References Cited

U.S. PATENT DOCUMENTS

| | | |
|---|---|---|
| 2011/0058077 A1 | 3/2011 | Ono |
| 2012/0211852 A1 | 8/2012 | Iwafuchi et al. |
| 2012/0211853 A1 | 8/2012 | Shimizu et al. |
| 2014/0306310 A1 | 10/2014 | Iwafuchi et al. |

FOREIGN PATENT DOCUMENTS

| | | |
|---|---|---|
| JP | 63-273353 A | 11/1998 |
| JP | 2005-136144 A | 5/2005 |
| JP | 2007-053337 A | 3/2007 |
| TW | 200534459 A | 10/2005 |
| TW | 201104902 A | 2/2011 |

OTHER PUBLICATIONS

Non-Final Office Action for U.S. Appl. No. 15/298,819, dated May 18, 2017, 10 pages.
Notice of Allowance for U.S. Appl. No. 13/352,846, dated Jul. 1, 2016, 07 pages.
Non-Final Office Action for U.S. Appl. No. 13/352,846, dated Mar. 14, 2016, 08 pages.
Final Office Action for U.S. Appl. No. 13/352,846, dated Nov. 18, 2015, 08 pages.
Non-Final Office Action for U.S. Appl. No. 13/352,846, dated May 8, 2015, 06 pages.

* cited by examiner

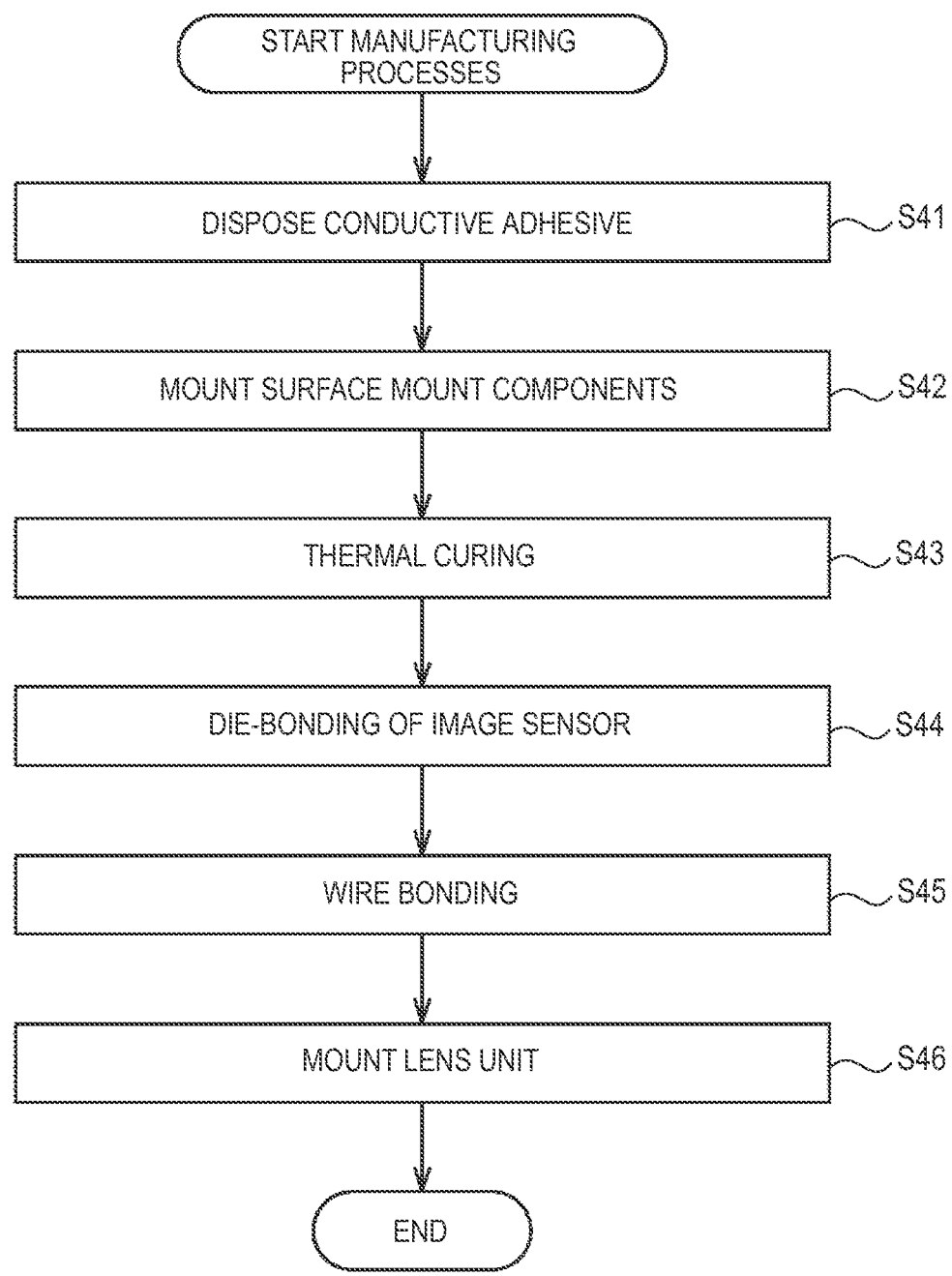

SOLID-STATE IMAGING APPARATUS AND METHOD OF MANUFACTURING THE SAME

CROSS REFERENCE TO RELATED APPLICATIONS

The present application is a continuation application of U.S. patent application Ser. No. 15/298,819, filed Oct. 20, 2016, which is a continuation application of U.S. patent application Ser. No. 13/352,846, filed Jan. 18, 2012, which claims the priority from prior Japanese Priority Patent Application JP 2011-033687 filed in the Japan Patent Office on Feb. 18, 2011, the entire content of which is hereby incorporated by reference.

FIELD

The present disclosure relates to a solid-state imaging apparatus and a method of manufacturing the same. More particularly, the present disclosure relates to a solid-state imaging apparatus in which flare and ghosts can be easily and reliably suppressed and a method of manufacturing such an apparatus.

BACKGROUND

Solid-state imaging apparatus for imaging an object by receiving light from the object are known in the related art. An image sensor forming a part of such a solid-state imaging apparatus has a rectangular light-receiving region, and a light beam entering the image sensor from a lens is projected on a surface of the image sensor in the form of a circular spot including the rectangular light-receiving region.

The light impinges also on external connection terminals disposed around the light-receiving region of the image sensor, and the light further impinges on bonding wires for leading out signals from the external connection terminals. As a result, the light can be reflected by the bonding wires to enter the light-receiving region, and an image obtained by the image sensor may consequently have flare or ghosts which can degrade the quality of the image.

As a result of the recent trend toward smaller image sensor chips, light beams can reach components which are surface-mounted around an image sensor chip. Electrodes of such surface mount components have high reflectance because they are formed by a solder material such as Sn, Ag, or Cu or a conductive adhesive containing conductive particles such as Ag, and flare and ghosts can be generated also as a result of reflection of light at the regions of such electrodes, which also degrades image quality.

Under the circumstance, it is a common practice to prevent unwanted light beams from entering a light-receiving region of an image sensor by disposing a shield member above the light-receiving region. However, according to such a method, it is difficult to suppress flare and ghosts effectively because the shield member and the light-receiving region of the image sensor must be precisely aligned with each other.

Another proposed technique is to prevent stray light by sealing bonding wires for connecting an image sensor and a substrate using a molding material along with cut surfaces of the chip (side surfaces) (See Patent Document 1 (JP-A-63-273353)).

SUMMARY

It has not been possible to suppress flare and ghosts sufficiently using the above-described techniques. Specifically, according to the method involving the process of sealing bonding wires with a molding material, bonding wires are looped at a height of about 100 to 200 μm above a top surface of a chip. Therefore, ghosts can be generated as a result of reflection of light impinging on the wires which are located higher than the ship surface.

There is a difference between the linear expansion coefficients of parts of the wires sealed with a molding material and unsealed parts of the wires. Thus, stress concentrates on the parts of the wires at the interface of the sealed parts thereof during a temperature cycle, which can result in open-circuit failures attributable to deformation or breakage of the wires. Further, the viscosity of a molding material drops immediately before the material begins to thermally set. Therefore, if wires are sealed with the molding material to a seal height which is substantially the same as the height of a chip, the molding material can climb up to a top surface of the chip, and the material can therefore bleed out from the chip surface into a light-receiving region. For this reason, it has been very difficult to control the amount of the molding material to be applied.

The technique described in the present disclosure has been conceived taking such a situation into consideration, and the technique makes it possible to prevent flare and ghosts easily and reliably.

An embodiment of the present disclosure is directed to a solid-state imaging apparatus including an imaging section having a light-receiving portion for receiving light from an object to image the object and a substrate on which the imaging section is disposed, wherein a predetermined member provided on the substrate in the neighborhood of the light-receiving portion is partially or entirely coated in black.

The predetermined member may be coated in black using inkjet printing.

The predetermined member may be a member located in a range on the substrate where the light from the object impinges, and a part of the predetermined member located within the range may be coated in black.

The predetermined member may be a member having reflectance of a predetermined value or higher provided on the substrate, and the predetermined member may be coated in black.

The predetermined member may be a wire connecting the substrate and the imaging section or a packaged component disposed on the substrate.

The embodiment of the present disclosure is also directed to a method of manufacturing a solid-state imaging apparatus, including: disposing an imaging section on a substrate, the imaging section having a light-receiving portion for receiving light from an object to image the object; and partially or entirely coating a predetermined member provided in the neighborhood of the light-receiving portion in black.

According to the embodiment of the present disclosure, an imaging section having a light-receiving portion for receiving light from an object to image the object is disposed on a substrate, and a predetermined member provided in the neighborhood of the light-receiving portion on the substrate is partially or entirely coated in black.

Another embodiment of the present disclosure is directed to a solid-state imaging apparatus including: an imaging section having a light-receiving portion for receiving light from an object to image the object; a substrate on which the imaging section is disposed; and a predetermined member disposed in the neighborhood of the light-receiving portion on the substrate and secured to the substrate with a conductive adhesive which is colored in black by a pigment added therein.

The another embodiment of the present disclosure is also directed to a method of manufacturing a solid-state imaging apparatus, including: disposing a conductive adhesive colored in black by a pigment added therein on a substrate; disposing a predetermined member in the region of the substrate where the conductive adhesive is disposed to connect the predetermined member to the substrate; and disposing an imaging section in the neighborhood of the predetermined member on the substrate, the imaging section having a light-receiving portion for receiving light from an object to image the object.

According to the another embodiment of the present disclosure, the conductive adhesive colored in black by a pigment added therein is disposed on a substrate, the predetermined member is disposed in the region of the substrate where the conductive adhesive is disposed to connect the predetermined member to the substrate, and the imaging section having the light-receiving portion for receiving light from an object to image the object is disposed in the neighborhood of the predetermined member on the substrate.

The another embodiments of the present disclosure make it possible to suppress flare and ghosts more easily and reliably.

BRIEF DESCRIPTION OF THE DRAWINGS

FIG. 8 is a flow chart for explaining processes for manufacturing a solid-state imaging apparatus.

DETAILED DESCRIPTION

Embodiments of the present disclosure will now be described with reference to the drawings.

First Embodiment

[Exemplary Configuration of Solid-State Imaging Apparatus]

Figure 1:
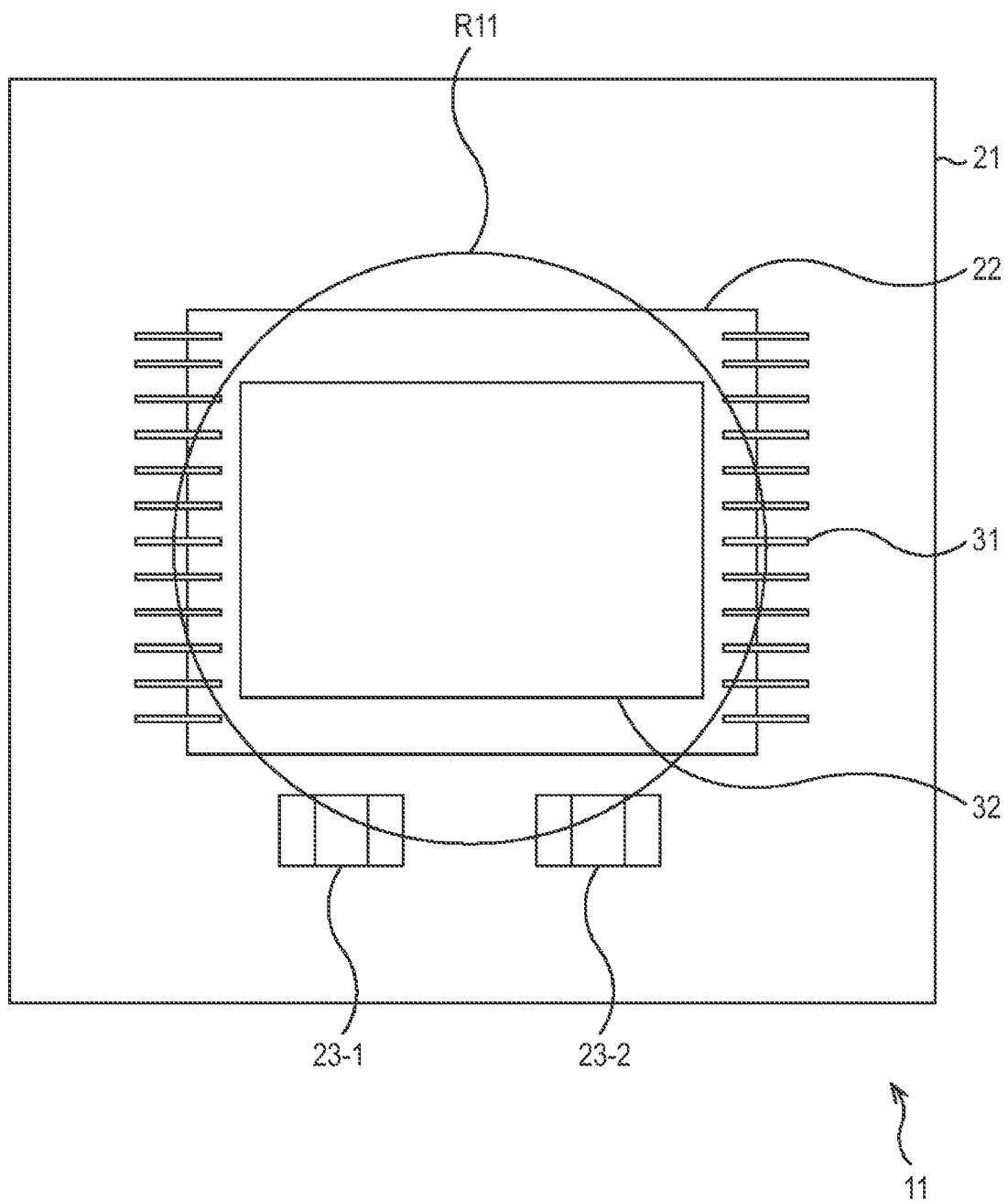
FIG. 1 is an illustration showing an exemplary configuration of an embodiment of a solid-state imaging apparatus according to the present disclosure.

FIG. 1 is an illustration showing an exemplary configuration of an embodiment of a solid-state imaging apparatus according to the present disclosure.

A solid-state imaging apparatus 11 includes a printed circuit board 21, an image sensor 22, and surface mount components 23-1 and 23-2.

The solid-state imaging apparatus 11 is an imaging apparatus which receives light from an object and photo-electrically converts the light to obtain an image of the object. The image sensor 22 and the surface mount components 23-1 and 23-2 are disposed on the printed circuit board 21 forming a part of the solid-state imaging apparatus 11, and a lens unit (not shown) is disposed on the near side of the printed circuit board 21 with respect to the plane of the drawing.

The image sensor 22 is electrically connected to the printed circuit board 21 by a plurality of bonding wires 31.

The image sensor 22 includes a light-receiving portion 32 which receives light entering from an object through a lens provided on the lens unit. The sensor performs photoelectric conversion of the light received at the light-receiving portion 32 to convert the received light into an electrical signal in accordance with the amount of light received. The image sensor 22 outputs the electrical signal obtained through photoelectric conversion to a control section provided on the printed circuit board 21 downstream of the sensor through the bonding wires.

The surface mount components 23-1 and 23-2 are passive components such as chip resistors, and the components are surface mount components forming a circuit for driving the solid-state imaging apparatus 11 disposed in the neighborhood of the image sensor 22. In the example shown in FIG. 1, the surface mount components 23-1 and 23-2 are disposed in the neighborhood of the image sensor 22.

Hereinafter, the surface mount components 23-1 and 23-2 may be collectively referred to as "surface mount components 23" when there is no need for discriminating them from each other.

Light from an object which has impinged on the lens of the lend unit to be collected by the lens is projected on a region R11 of the printed circuit board 21. The region R11 is a circular region including the rectangular light-receiving portion 32 therein. A part of the light which has reached the region R11 impinges on the light-receiving portion 32, and the light is converted into an electrical signal representing an image of the object.

As thus described, not all of light beams collected by the lens unit of the solid-state imaging apparatus 11 impinge on the light-receiving portion 32, and some of the collected light beams are projected on the bonding wires and the surface mount components 23 disposed in the neighborhood of the light-receiving portion 32.

When the light impinging on the bonding wires and the surface mount components 23 enters the light-receiving portion 32 by being reflected on surfaces of the bonding wires and the surface mount components 23, flare and ghosts can appear on the resultant image, and the image may therefore have low quality.

Figure 2:
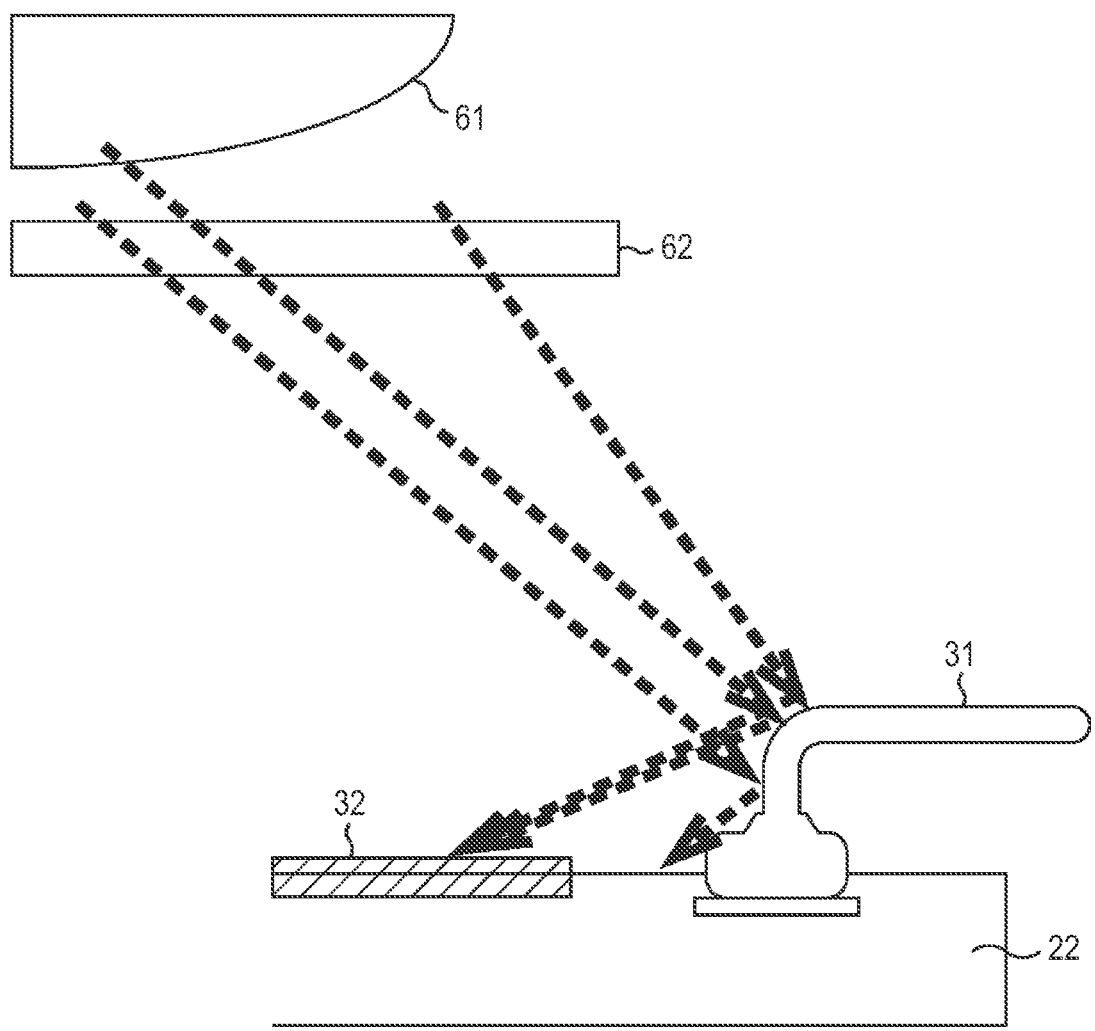
FIG. 2 is an illustration for explaining reflection of light at a bonding wire.

For example, let us assume that light from an object impinges on a lens 61 forming a part of the lens unit as shown in FIG. 2 and that light collected by the lens 61 impinges on the bonding wires 31 through an infrared cutoff filter 62 as indicated by dotted lines in FIG. 2. The dotted lines in FIG. 2 represent optical paths of some beams of light from the object collected by the lens 61. A feature which is identical between FIGS. 1 and 2 is indicated by the same reference numeral in both figures, and description of such a feature may be omitted in the following if appropriate.

In the example shown in FIG. 2, since no particular treatment is performed on the bonding wires 31, the surface of the bonding wires 31 has high reflectance. Therefore, most of light coming from the lens 61 and impinging on the bonding wires 31 is reflected on the surface of the bonding wires 31 to enter the light-receiving portion 32.

Figure 3:
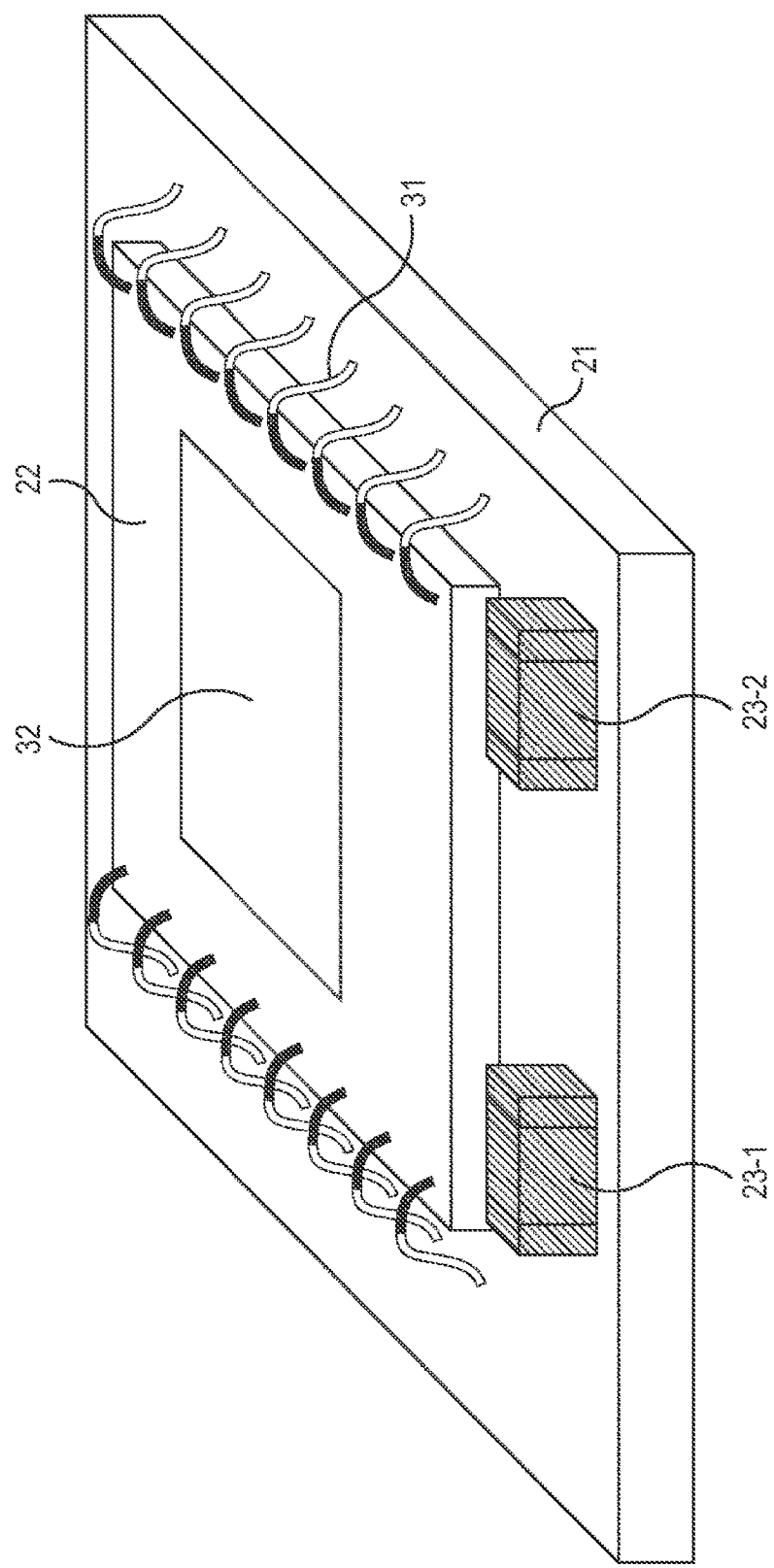
FIG. 3 is an illustration for explaining suppression of reflection achieved by inkjet printing.

A measure against the problem is taken in the solid-state imaging apparatus 11. As shown in FIG. 3, the bonding wires 31 connecting the printed circuit board 21 and the image sensor 22 are coated in black in parts thereof located on the side closer to the light-receiving portion 32, and the surface of the surface mount components 23 is also coated in black. A feature which is identical between FIGS. 1 and 3 is indicated by the same reference numeral, and description of such a feature may be omitted in the following if appropriate.

Referring to FIG. 3, the black regions of the bonding wires 31 and the hatched regions of the surface mount components 23 are regions which are coated in black such that they will exhibit low reflectance against light. The black coating serving as a light shield is provided using, light shield printing such as inkjet printing.

For example, the inkjet printing is preferably performed using UV (ultraviolet) ink when the tact time (processing time) of the process and the spread of printed ink is taken into account. However, the present disclosure is not limited to the use of UV ink, and any type of ink may be used as long as it can be easily cured.

Preferably, the inkjet-printed coating is provided on components around the image sensor 22 such as the bonding wires 31 and the surface mount components 23 only in parts of the components on which light from the lens unit impinges or parts of the components included in the region R11 shown in FIG. 1.

Alternatively, the coating may be provided on the entire surface of the components (members) in the neighborhood of the image sensor 22 such as the bonding wires 31 and the surface mount components 23 because what is required is to keep the reflectance of parts of the components on which light from the lens unit impinge low. The black coating may alternatively be selectively provided to cover only components having high reflectance or components having reflectance equal to or higher than a predetermined value among components in the neighborhood of the image sensor 22 such as the bonding wires 31.

Figure 4:
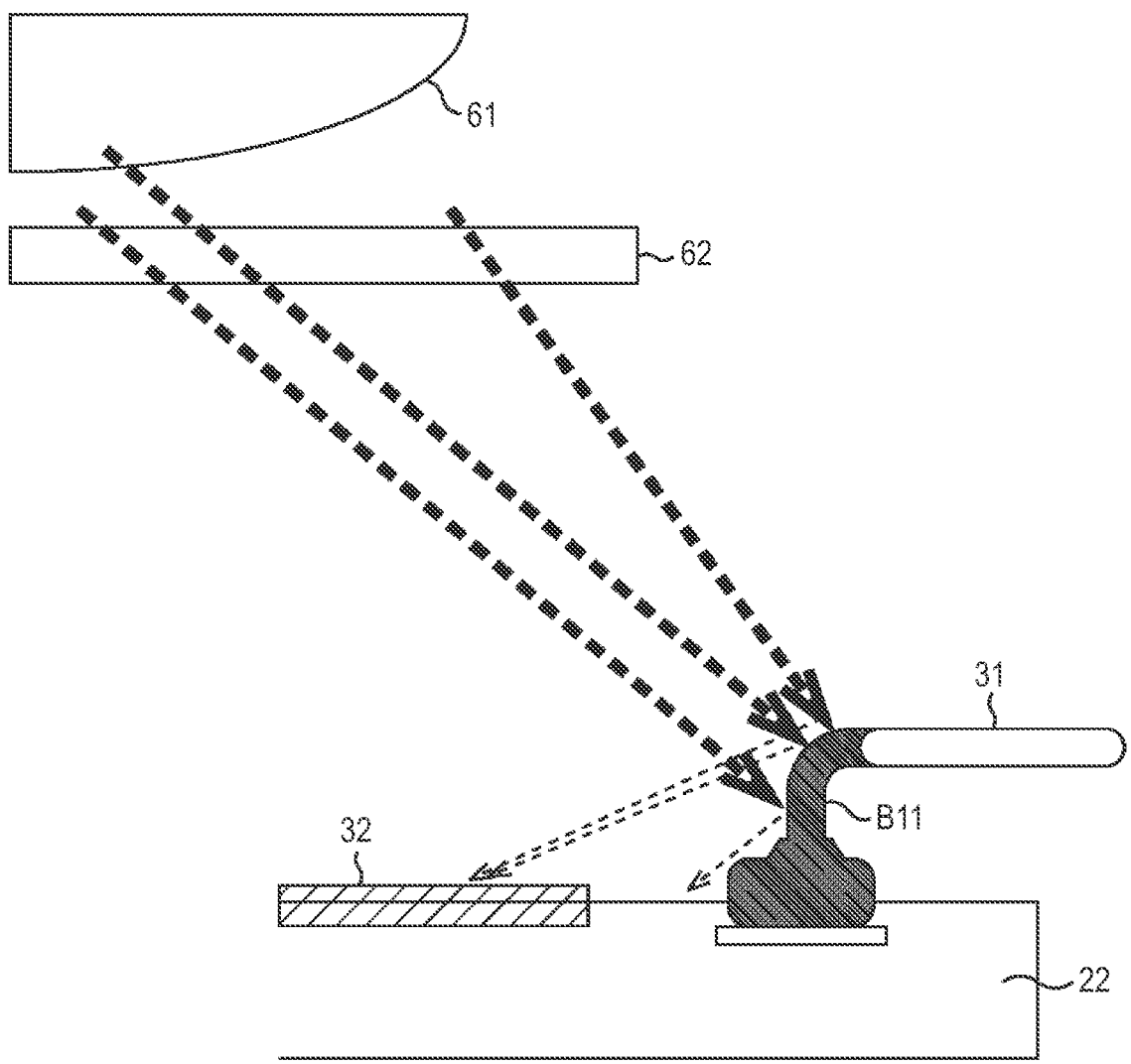
FIG. 4 is an illustration for explaining suppression of reflection of light at a bonding wire.

When a black coating is provided on the surface of components in the neighborhood of the image sensor 22 as thus described, for example, the reflectance of the surface of the bonding wires 31 is kept lower than the reflectance that the wires have without the coating in parts of the wires on the side thereof closer to the light-receiving portion 32, as shown in FIG. 4. A feature which is identical between FIGS. 2 and 4 is indicated by the same reference numeral, and description of such a feature will be omitted if appropriate. In FIG. 4, the optical paths of some of light beams traveling from the lens 61 and impinging on the bonding wires 31 through the infrared cutoff filter 62 are represented by dotted lines.

In the example shown in FIG. 4, regions B11 of the bonding wires 31 on the side of the wires closer to the light-receiving portion 32 are coated with UV ink for shielding the wires from light, and the reflectance of the bonding wires 31 is lower in the regions B11 than in other regions thereof. As a result, reflection of light coming from the lens 61 and impinging on the regions B11 is suppressed, and only a small part of the light from the lens 61 is reflected to impinge on the light-receiving portion 32.

As thus described, when components in the neighborhood of the image sensor 22 such as the bonding wires 31 are coated in black using a light shield printing process, reflection of light can be suppressed at coated parts to prevent unnecessary light from impinging on the image sensor 22. As a result, flare and ghosts can be simply and reliably suppressed to obtain an image of high quality.

For example, when the components in the neighborhood of the image sensor 22 are coated using a light shield printing process, desired parts of the components can be selectively coated, which is advantageous than sealing the bonding wires with a molding material in that flare and ghosts can be more reliably suppressed at a lower cost. It is advantageous to coat the bonding wires and the like using light shield printing also in that a compact image sensor chip can be obtained because coated regions occupy a space smaller than a space required for sealing the wires with a molding material.

Further, the solid-state imaging apparatus 11 does not need to have a member such as a shield plate for shielding components in the vicinity of the image sensor 22 from light coming from the lens unit. Therefore, flare and ghosts can be sufficiently suppressed without relying on the precision of assembly of components forming the solid-state imaging apparatus 11.

[Manufacture of Solid-State Imaging Apparatus]

Figure 5:
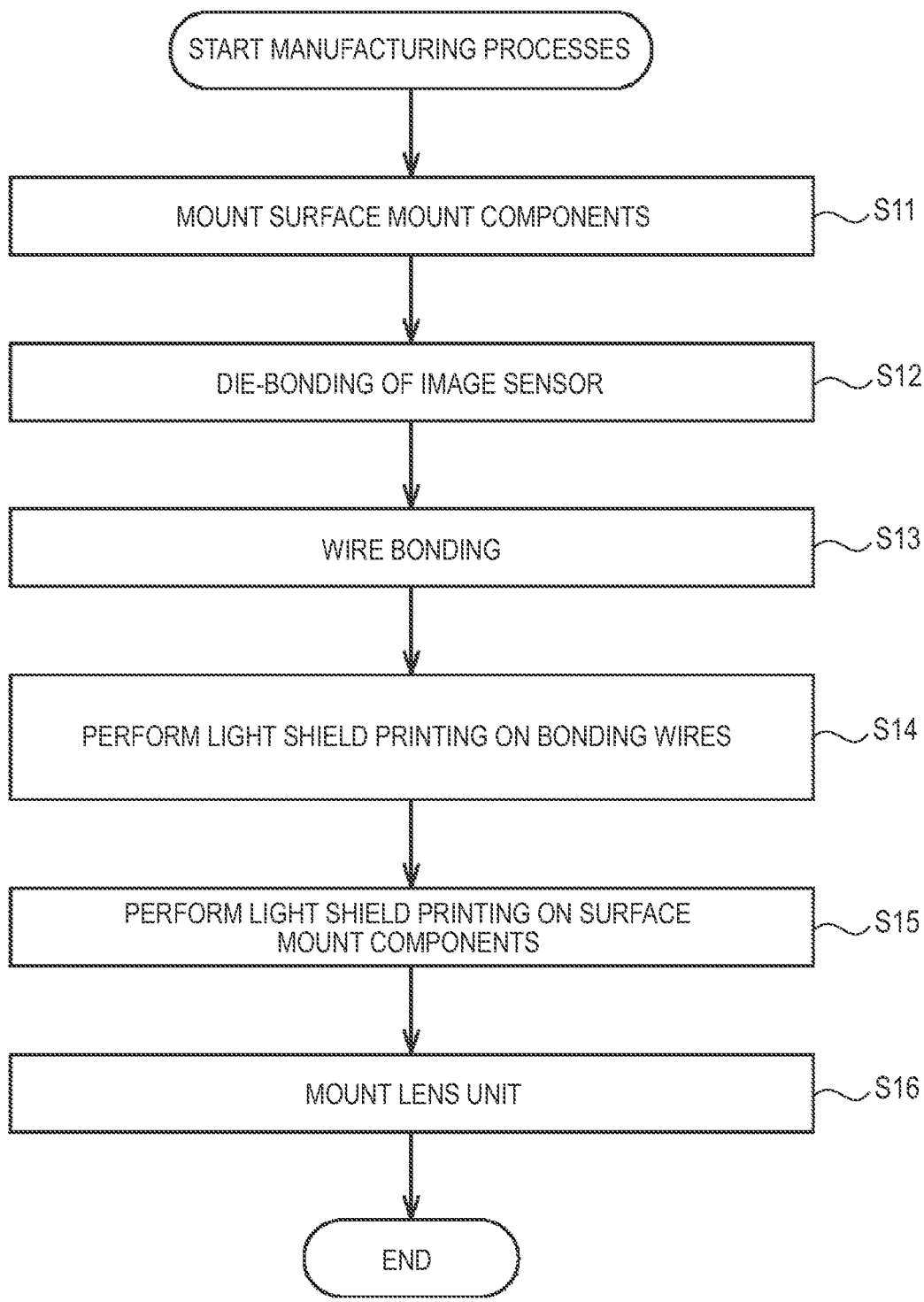
FIG. 5 is a flow chart for explaining processes for manufacturing a solid-state imaging apparatus.

Processes for manufacturing the solid-state imaging apparatus 11 shown in FIG. 1 will now be described with reference to the flow chart shown in FIG. 5.

At step S11, surface mount components are mounted on an aggregate board formed by a plurality of printed circuit boards.

Figure 6:
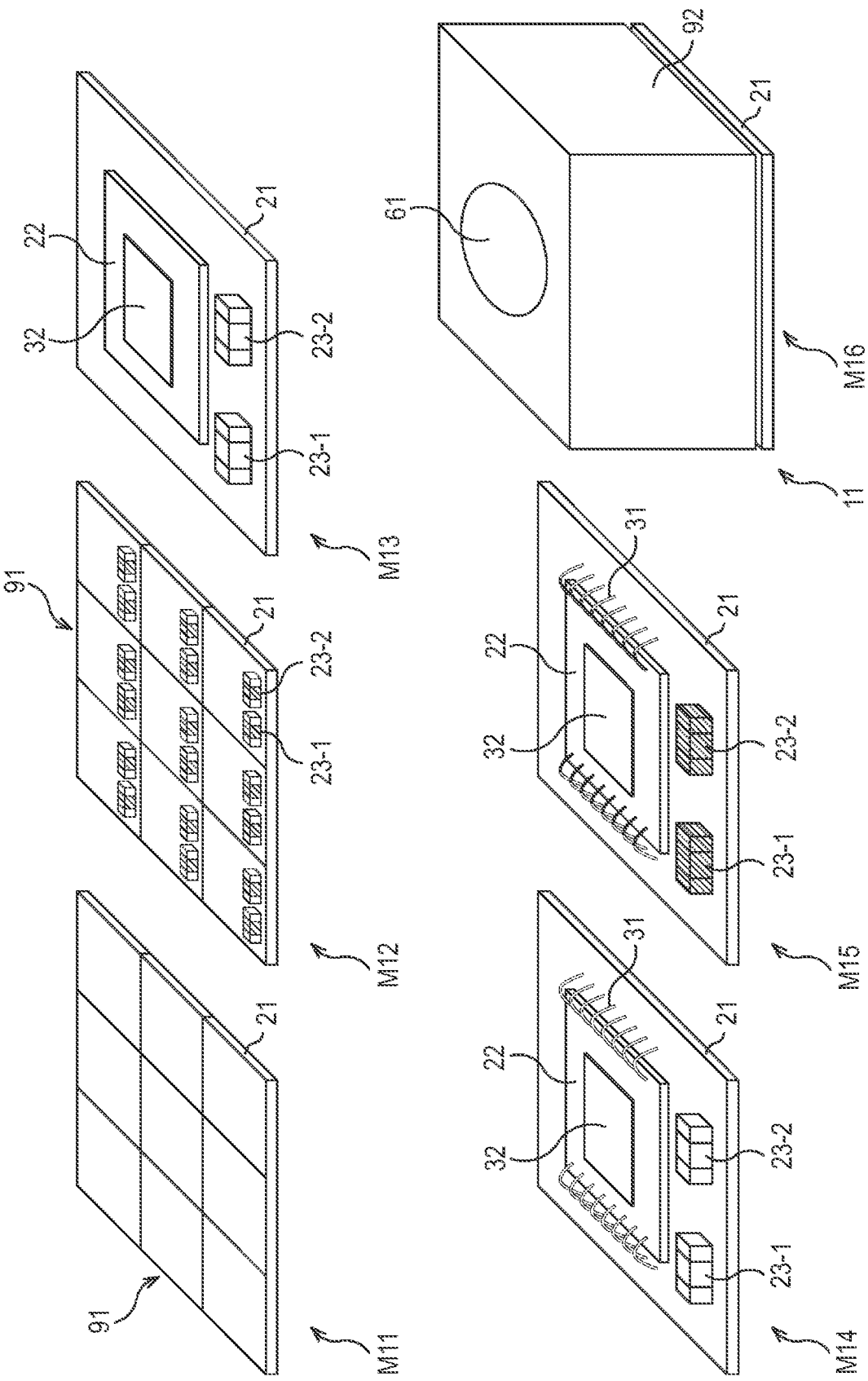
FIG. 6 is illustrations for explaining steps for manufacturing solid-state imaging apparatus.

For example, an aggregate board 91 formed by a plurality of printed circuit boards including a printed circuit board 21 is provided as indicated by an arrow M11 in FIG. 6. Required surface mount components are disposed and secured on each of the printed circuit boards forming the aggregate board 91 as indicated by an arrow M12. A feature which is identical between FIG. 6 and FIG. 1 or 4 is indicated by the same reference numeral, and description of such a feature may be omitted if appropriate.

For example, the bottom right part of the aggregate board 91 indicated by the arrow M12 is a printed circuit board 21, and surface mount components 23-1 and 23-2 are disposed and secured on the printed circuit board 21.

When surface mount components are mounted on the aggregate board 91 as thus described, the printed circuit boards forming the aggregate board 91 are separated from each other, and the printed circuit boards are thereafter processed to manufacture solid-state imaging apparatus.

Referring to the flow chart in FIG. 5 again, an image sensor 22 is die-bonded onto the printed circuit board 21 at step S12. For example, the image sensor 22 is disposed on the printed circuit board 21 as indicated by an arrow M13 in FIG. 6, and the image sensor 22 is secured on the printed circuit board 21 using an adhesive.

At step S13, wire bonding is performed between the printed circuit board 21 and the image sensor 22. For example, the printed circuit board 21 and the image sensor 22 are electrically connected by a plurality of bonding wires 31 as indicated by an arrow M14 in FIG. 6. More specifically, terminals of the image sensor 22 and pads provided at ends of signal lines on the printed circuit board 21 are connected by the bonding wires 31.

At step S14, light shield printing (inkjet printing) is performed on the bonding wires connected to the image sensor 22. For example, UV ink is selectively inkjet-printed and cured on parts of the wires which are included in a region R11 as shown in FIG. 1 or parts of the wires on which light from an object impinges, among the bonding wires connected to the image sensor 22 such as the bonding wires 31. Thus, the printed regions of the bonding wires are coated with UV ink.

At step S15, light shield printing is performed on the surface mount components 23. For example, UV ink is selectively inkjet-printed and cured on parts of the surface mount components 23 which are included in the region R11 as shown in FIG. 1 or parts of the components which have high reflectance.

As a result of the processes at steps S14 and S15, for example, parts of the bonding wires 31 on the printed circuit board 21 and the entire surface of the surface mount components 23 are coated with UV ink as indicated by an arrow M15 in FIG. 6. In FIG. 6, the black parts of the bonding wires 31 and the hatched parts of the surface mount components 23 are coated parts.

Referring to the flow chart shown in FIG. 5 again, a lens unit is mounted on the printed circuit board 21 to form a solid-state imaging apparatus 11 at step S16, and the series of manufacturing processes terminates.

For example, as indicated by an arrow M16 in FIG. 6, a lens unit 92 having a lens 61 is disposed on the print circuit board 21 such that components including the image sensor 22 will be covered, and the unit is secured to the printed circuit board 21. Thus, an apparatus including a lens unit 92 and a printed circuit board 21 is provided as a solid-state imaging apparatus 11.

Figure 7:
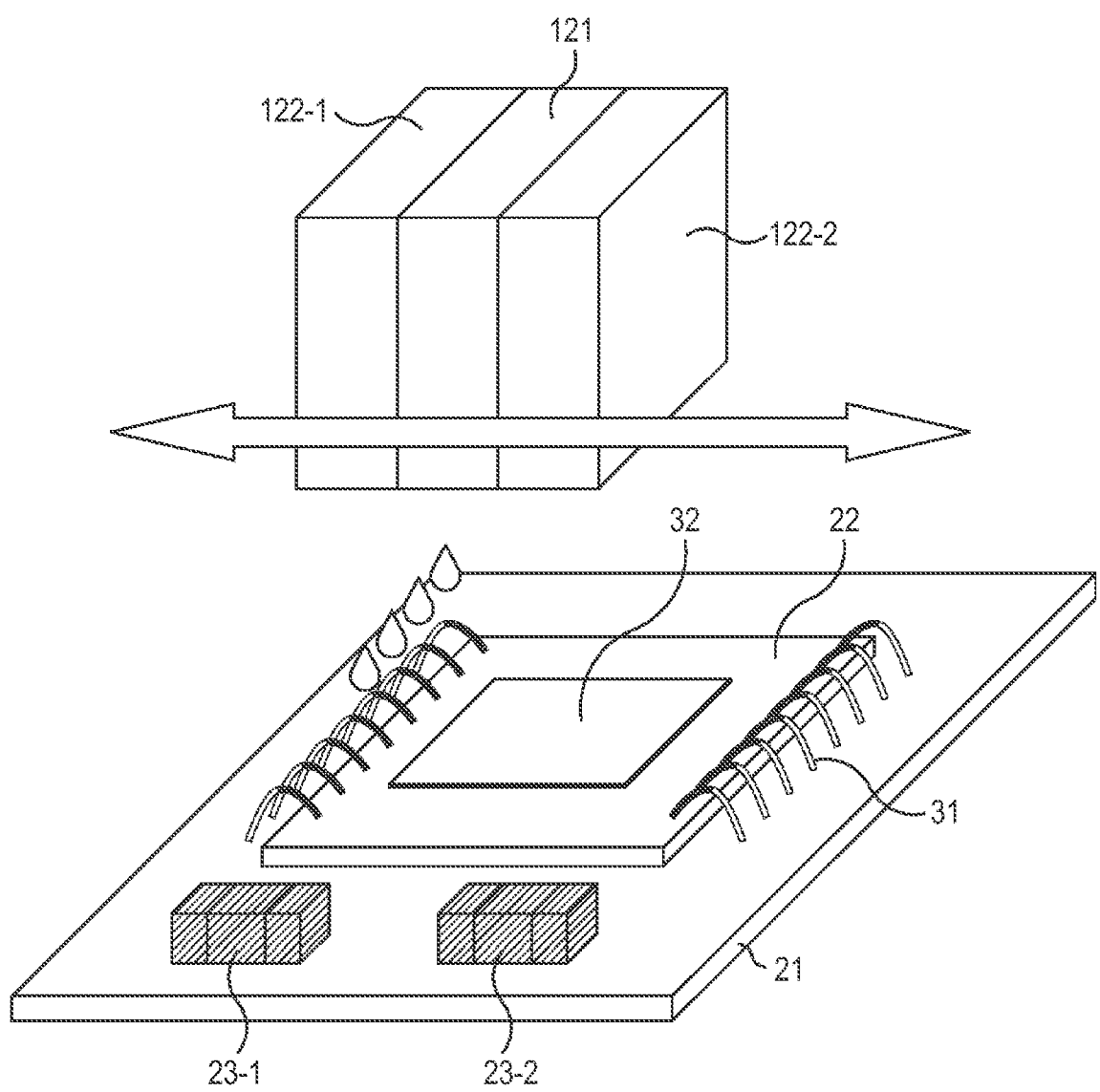
FIG. 7 is an illustration for explaining inkjet printing.

More specifically, light shield printing (inkjet printing) at steps S14 and S15 is carried out, for example, by applying (printing) and curing UV ink on the members around the image sensor 22 repeatedly as shown in FIG. 7. A feature which is identical between FIGS. 1 and 7 is indicated by the same reference numeral, and description of such a feature may be omitted as occasion demands.

In the example shown in FIG. 7, an inkjet head 121 which is located above the printed circuit board 21 in the illustration ejects UV ink while reciprocating to the left and right to apply UV ink to desired positions of the bonding wires 31 and the like. Thus, UV ink is applied to (printed on) the black regions of the bonding wires.

After the inkjet head 121 ejects UV ink, the UV ink is cured by UV lamps 122-1 and 122-2 which are provided on left and right ends of the inkjet head 121 in FIG. 7. That is, the UV lamps 122-1 and 122-2 irradiate the parts of the bonding wires having the UV ink applied thereon with ultraviolet light to cure the UV ink.

Inkjet printing is carried out by the inkjet head 121 which ejects and cures UV ink repeatedly while moving to the left and right in illustration as described above. After inkjet printing is performed on the bonding wires such as the bonding wires 31, inkjet printing is similarly performed on the surface mount components 23.

When UV ink is used as the inkjet material for the inkjet printing process, a reduction in the yield of solid-state imaging apparatus 11 attributable to bleeding out of the ink material can be prevented because the material can be quickly cured.

As thus described, flare and ghosts can be easily and reliably suppressed by providing a black coating on members around the image sensor 22.

Modification

In the above description, members around the image sensor 22 are coated using inkjet printing, a black resin may alternatively be applied to the bonding wires and the surface mount components 23 when there is a sufficient distance between the light-receiving portion 32 and the bonding wires 31. That is, protection may be provided by sealing the components with a liquid material.

When a black resin is applied to the bonding wires 31 and the surface mount components 23 using a dispenser or the like as thus described, reflection of light impinging on the surface of the bonding wires 31 and the surface mount components 23 from the lens 61 can be suppressed by the black resin. Thus, generation of flare and ghosts can be suppressed to prevent degradation of the quality of an image.

When a black resin is to be applied using a dispenser, in order to prevent a chip on the printed circuit board 21 from being contaminated as a result of bleeding out of the black resin after the application of the resin, it is preferable to impart UV curability to the resin to allow the resin to be cured immediately after being applied to a surface. In this case, it is preferable to perform preliminary curing of the resin and to perform thermal curing thereafter to cure the resin completely.

Further, when a black resin is applied to the bonding wires 31 using a dispenser, voids (bubbles) are likely to be generated in the resin applied in the gap the between the bonding wires 31 and the image sensor 22. In order to suppress the generation of voids, it is desirable to perform wire bonding such that the wires are looped with a loop height as small as about 30 to 70 μm.

Second Embodiment

[Manufacture of Solid-State Imaging Apparatus]

When surface mount components 23 are mounted on a printed circuit board 21, the surface mount components 23 may be secured to the board using a conductive adhesive which is colored in black. Manufacturing processes performed in such a case will be described below with reference to the flow chart in FIG. 8.

At step S41, a conductive adhesive colored in black using carbon black is dispensed or printed on (applied to) connection lands of the printed circuit board 21 for connecting the surface mount components 23 to the board.

At step S42, the surface mount components 23 are mounted on the printed circuit board 21 in the positions where the conductive adhesive has been disposed. More specifically, for example, electrode portions of the surface mount components 23 may be disposed on the connection lands of the printed circuit board 21.

At step S43, thermal curing is performed on the conductive adhesive. As a result, the conductive adhesive is cured to secure the surface mount components 23 on the printed circuit board 21 and to electrically connect the printed circuit board 21 and the surface mount components 23.

At step S44, an image sensor 22 is die-bonded onto the printed circuit board 21. For example, the image sensor 22 is secured to the printed circuit board 21 using an adhesive. Further, wire bonding is carried out between the printed circuit board 21 and the image sensor 22 at step S45.

At step S46, a lens unit 92 is mounted on the printed circuit board 21 to form a solid-state imaging apparatus 11, and the series of manufacturing processes is terminated.

When a solid-state imaging apparatus 11 is manufactured as described above, the parts connecting the printed circuit board 21 and the surface mount components 23 and lateral parts of the surface mount components 23 are covered by the black conductive adhesive. Since the reflectance of such a conductive adhesive is normally lower than the reflectance of solder used for securing the surface mount components 23, even when light from a lens 61 impinges on the conductive adhesive applied to the parts for connecting the surface mount components 23, the reflection of light can be suppressed. As a result, it is possible to prevent unwanted light from impinging on a light-receiving portion 32, and flare and ghosts can therefore be sufficiently suppressed.

Any type of conductive adhesive may be used for mounting the surface mount components 23 as long as it is a conductive material colored in black by adding a pigment such as carbon black.

The present disclosure is not limited to the above-described embodiments, and various modifications may be made without departing from the spirit of the present disclosure.

The present disclosure contains subject matter related to that disclosed in Japanese Priority Patent Application JP 2011-033687 filed in the Japan Patent Office on Feb. 18, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus, comprising:
   a substrate;
   an imaging section on the substrate, wherein the imaging section is configured to generate an image based on light received from an object; and
   at least one bonding wire on the substrate, wherein
   the imaging section and the substrate are electrically connected by the at least one bonding wire, and
   the at least one bonding wire is at least partially covered by a black material.

2. The imaging apparatus according to claim 1, wherein the black material comprises black ink.

3. The imaging apparatus according to claim 2, wherein the at least one bonding wire is coated with the black ink based on an inkjet printing process.

4. The imaging apparatus according to claim 1, wherein the black material comprises a black resin.

5. The imaging apparatus according to claim 4, wherein the black resin comprises a ultraviolet (UV) curability type resin.

6. The imaging apparatus according to claim 1, further comprising
   a passive component on the substrate,
   wherein the passive component is coated with the black material.

7. The imaging apparatus according to claim 6, wherein the passive component is coated with the black material based on an inkjet printing process.

8. The imaging apparatus according to claim 6, wherein the passive component comprises a resistor.

9. The imaging apparatus according to claim 1, further comprising a lens unit configured to:
   collect the light; and
   project the light on a determined region of the substrate, wherein the at least one bonding wire is on the determined region of the substrate.

10. The imaging apparatus according to claim 9, further comprising
    a passive component on the substrate, wherein
    the passive component is coated with the black material, and
    the passive component is on the determined region of the substrate.

11. The imaging apparatus according to claim 9, further comprising an infrared cutoff filter between the lens unit and the imaging section.

12. The imaging apparatus according to claim 1, wherein the at least one bonding wire is entirely covered by the black material.

13. The imaging apparatus according to claim 1, wherein the at least one bonding wire has a reflectance equal to or greater than a threshold reflectance value.

* * * * *